(12) United States Patent
Field, III et al.

(10) Patent No.: US 12,476,586 B2
(45) Date of Patent: Nov. 18, 2025

(54) FLEXIBLE ELECTRONIC DEVICES

(71) Applicant: NanoFlex Power Corporation, Scottsdale, AZ (US)

(72) Inventors: Richard Field, III, Scotsdale, AZ (US); Steven Wolgast, Scottsdale, AZ (US); Olga Griffith, Scottsdale, AZ (US); Adam Barito, Scottsdale, AZ (US); J. Norman Allen, Scottsdale, AZ (US)

(73) Assignee: NanoFlex Power Corporation, Scottsdale, AZ (US)

( * ) Notice: Subject to any disclaimer, the term of this patent is extended or adjusted under 35 U.S.C. 154(b) by 189 days.

(21) Appl. No.: 18/389,493

(22) Filed: Nov. 14, 2023

(65) Prior Publication Data

US 2024/0162857 A1     May 16, 2024

Related U.S. Application Data

(60) Provisional application No. 63/383,569, filed on Nov. 14, 2022.

(51) Int. Cl.
| | |
|---|---|
| *H10K 39/10* | (2023.01) |
| *H02J 7/35* | (2006.01) |
| *H02S 40/38* | (2014.01) |
| *H05K 1/02* | (2006.01) |

(52) U.S. Cl.
CPC ............. *H02S 40/38* (2014.12); *H02J 7/35* (2013.01); *H05K 1/028* (2013.01); *H10K 39/10* (2023.02); *H05K 2201/10098* (2013.01); *H05K 2201/10151* (2013.01)

(58) Field of Classification Search
CPC ............ H02S 40/38; H10K 39/10; H02J 7/35; H05K 1/028
USPC ............................................. 361/749
See application file for complete search history.

(56) References Cited

U.S. PATENT DOCUMENTS

2015/0373831 A1* 12/2015 Rogers ................. H01L 23/22
                                                          29/829
2022/0225492 A1* 7/2022 Nguyen ................. B32B 3/30

* cited by examiner

*Primary Examiner* — Andargie M Aychillhum
(74) *Attorney, Agent, or Firm* — Finnegan, Henderson, Farabow, Garrett & Dunner, LLP

(57) ABSTRACT

A photovoltaic powered flexible electronic device comprising a flexible photovoltaic module, electrodes (such as anode and cathode) incorporated into the flexible photovoltaic module, wherein the electrodes are at least partially exposed, and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode and anode electrodes; an energy storage unit; and a radio emitting device, wherein the photovoltaic powered flexible electronic device comprises a Young's Modulus of 150 GPa or less. The flexible electronic device can be a flexible organic electronic device.

23 Claims, 6 Drawing Sheets

FLEXIBLE ELECTRONIC DEVICES

CROSS-REFERENCE TO RELATED APPLICATIONS

This application claims the benefit of U.S. Provisional Application No. 63/383,569, filed October Nov. 14, 2022, which is incorporated herein by reference in its entirety.

FIELD OF THE INVENTION

The present disclosure generally relates to flexible electronic devices or flexible electronics in combination with a photovoltaic module.

BACKGROUND

The present disclosure is directed to flexible electronic devices comprising a photovoltaic device integrating a photovoltaic module with electronics devices by exposing and utilizing a shared electrical contact. Photovoltaic cells have myriad uses and may be employed to power most devices. Photovoltaic cells may, however, be limited by size, particularly when they are disposed on large, anchored photovoltaic panels. Photovoltaic cells may also be limited by power consumption, and/or rigidity.

The present disclosure is directed to a flexible electronic device in which the photovoltaic module and an electronics device are attached, laminated and/or encapsulated together. The present disclosure expands the uses for photovoltaic module powering since the electronics device would be able to be powered solely by the photovoltaic module without any need for an external source. The onboard photovoltaic module may also increase the available energy and/or extend the lifetime of the device over other solutions including those using any energy storage units. The energy storage unit may comprise a primary/secondary battery and/or capacitor, or any combination of batteries and/or capacitors. The capacitor may be a supercapacitor.

The devices disclosed herein could be used in downstream markets including, but not limited to, agriculture, indoor farming, ecology, livestock tracking, building/home automation, Internet of Things (IoT), recreation, wearable devices, smartphones, tablets, computers, watches, jewelry, energy infrastructure, medical monitoring devices and biomedical patches, retail, cold chain, food transport/packaging/storage/preparation/serving, logistics, air/land/water transportation, aerospace, shipping, asset tracking, location/movement/vibration monitoring, architecture, military, defense and surveillance, radar and remote sensing, modular power harvesting and/or radio device, building/home monitoring, tamper resistant monitoring, alert systems, automation, automotive, and building integrated photovoltaics. For example, the proposed device could be used as a flexible smart label in specific applications including, but not limited to, shipping labels and product labels in stores, in which the smart labels are powered completely by the integrated photovoltaic module. In these embodiments, the smart labels may be attached to all surfaces, including curved or irregular surfaces.

In order to integrate the photovoltaic modules directly with electronics devices, disclosed here are techniques to expose and use a shared electrical contact between the two devices. The photovoltaic module has contacts, and these contacts may comprise cathode and anode contacts and/or external/busbars connections that are exposed by, for example but not limited to removing the substrate and/or encapsulation material, and then electronics are printed and/or attached to the opposite side from the photovoltaic or anywhere within the entire device except the active area of a photovoltaic, i.e., the area that generates current upon absorption of illumination. In other words, electronic components can be attached to a back surface, side surface, or front surface of the photovoltaic module so long as the electronics are not attached on an active area of the photovoltaic module. The entire device (photovoltaic module plus electronics device) is packaged/laminated/encapsulated together, producing a thin, potentially completely self-contained device.

In some embodiments, the device is formed by attaching a flexible electronic device onto a flexible photovoltaic module. For example, the device could be a photovoltaic-powered sensor, or a label. The devices can sense and transmit data wirelessly with an onboard radio. The onboard photovoltaic can increase the available energy and/or extend the lifetime of the device over other solutions, such as but not limited to using the energy storage units. This, for example, promotes more frequent or constant communication, and/or ability to power more electronics that use more energy.

In certain embodiments, the present disclosure is directed to a photovoltaic powered flexible electronic device comprising a flexible photovoltaic module, electrodes (such as anode and cathode) incorporated into the flexible photovoltaic module, wherein the electrodes are at least partially exposed, and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode and anode electrodes; an energy storage unit; and a radio emitting device, wherein the photovoltaic powered flexible electronic device comprises a Young's Modulus of 150 GPa or less.

In some embodiments, a photovoltaic powered flexible electronic device comprising a flexible photovoltaic module, a cathode and an anode electrodes incorporated into the flexible photovoltaic module, wherein the cathode and the anode electrodes are at least partially exposed, and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode and anode electrodes; an energy storage unit; and a radio emitting device, wherein the photovoltaic powered flexible electronic device comprises a minimum bend radius ranging from 1 mm to 100 mm.

Further embodiments of the present disclosure are directed to an organic photovoltaic powered flexible electronic device comprising a flexible organic photovoltaic module, a cathode and an anode electrodes incorporated into the flexible organic photovoltaic module, wherein the cathode and the anode electrodes are at least partially exposed, and a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode and anode electrodes; an energy storage unit; and a radio emitting device, wherein the photovoltaic powered flexible electronic device comprises a Young's Modulus of 150 GPa or less.

Further embodiments of the present disclosure are directed to an organic photovoltaic powered flexible electronic device comprising a flexible organic photovoltaic module, a cathode and an anode electrodes incorporated into the flexible organic photovoltaic module, wherein the cathode and the anode electrodes are at least partially exposed, and a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode and anode electrodes; an energy storage unit; and a radio emitting device, wherein the organic photovoltaic powered flexible electronic device comprises a minimum bend radius ranging from 1 mm to 100 mm.

In certain embodiments, the present disclosure is directed to a photovoltaic powered flexible electronic device comprising a flexible photovoltaic module; a cathode and an anode electrodes incorporated into the flexible photovoltaic module, wherein the cathode and the anode electrodes are at least partially exposed; and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode and anode electrodes; an energy storage unit; and a power supply connector, wherein the photovoltaic powered flexible electronic device comprises a Young's Modulus of 150 GPa or less.

In certain embodiments, the present disclosure is directed to a photovoltaic powered flexible electronic device comprising a flexible photovoltaic module; a cathode and an anode electrodes incorporated into the flexible photovoltaic module, wherein the cathode and the anode electrodes are at least partially exposed; and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode and anode electrodes; an energy storage unit; and a power supply connector, wherein the photovoltaic powered flexible electronic device comprises a minimum bend radius ranging from 1 mm to 100 mm.

Further embodiments of the present disclosure are directed to an organic photovoltaic powered flexible electronic device comprising a flexible organic photovoltaic module; a cathode and an anode electrodes incorporated into the flexible organic photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode electrode and anode electrode; an energy storage unit; and a power supply connector, wherein the organic photovoltaic powered flexible electronic device comprises a Young's Modulus of 150 GPa or less.

Further embodiments of the present disclosure are directed to an organic photovoltaic powered flexible electronic device comprising a flexible organic photovoltaic module; a cathode electrode and a anode electrode incorporated into the flexible organic photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode electrode and anode electrode; an energy storage unit; and a power supply connector, wherein the organic photovoltaic powered flexible electronic device comprises a minimum bend radius ranging from 1 mm to 100 mm.

Additional embodiments of the present disclosure are directed to a device comprising a flexible photovoltaic module; a cathode electrode and a anode electrode incorporated into the flexible photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit comprising a power management device, wherein the recharging circuit is electrically connected to the cathode electrode and anode electrode; an energy storage unit; and a power supply connector, wherein the organic photovoltaic powered flexible electronic device comprises a Young's Modulus of 150 GPa or less. In certain of these embodiments, the flexible photovoltaic module is a flexible organic photovoltaic module.

Additional embodiments of the present disclosure are directed to a device comprising a flexible photovoltaic module; a cathode electrode and a anode electrode incorporated into the flexible photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit comprising a power management device, wherein the recharging circuit is electrically connected to the cathode electrode and anode electrode; an energy storage unit; and a power supply connector, wherein the organic photovoltaic powered flexible electronic device comprises a minimum bend radius ranging from 1 mm to 100 mm. In certain of these embodiments, the flexible photovoltaic module is a flexible organic photovoltaic module.

Other embodiments of the present disclosure are set forth below.

It is to be understood that both the foregoing general description and the following detailed description are exemplary and explanatory only and are not restrictive of the invention, as claimed.

BRIEF DESCRIPTION OF THE DRAWINGS

The accompanying figures, which are incorporated in and constitute a part of this specification, illustrate several embodiments of the invention and together with the description, serve to explain the principles of the invention.

The drawings described herein are for illustrative purposes only of selected embodiments and not all possible implementations and are not intended to limit the scope of the present disclosure. Corresponding reference numerals indicate corresponding parts throughout the several views of the drawings.

DETAILED DESCRIPTION

Figure 1:
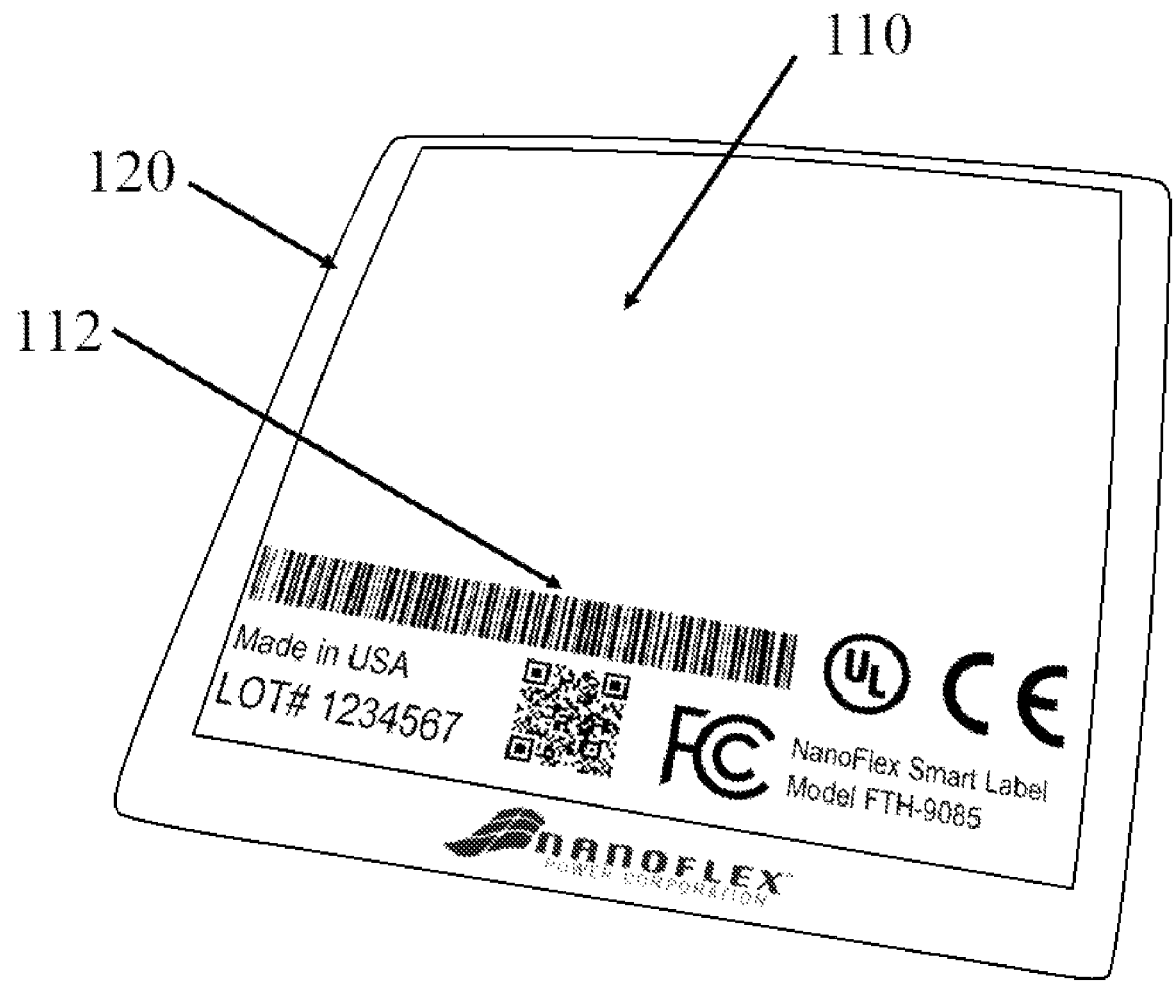
FIG. 1 is an illustration of the photovoltaic powered flexible electronic device in some embodiments of the present disclosure.

Certain embodiments of the present disclosure are directed to a photovoltaic powered flexible electronic device comprising a flexible photovoltaic module, a cathode electrode and a anode electrode incorporated into the flexible photovoltaic module, wherein the cathode electrode and the anode electrode are at least partially exposed, and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode electrode and anode electrode; an energy storage unit; and a radio emitting device, wherein the photovoltaic powered flexible electronic device comprises a Young's Modulus of 150 GPa or less.

In other embodiments, the present disclosure is directed to a photovoltaic powered flexible electronic device comprising a flexible photovoltaic module, a cathode electrode and a anode electrode incorporated into the flexible photovoltaic module, wherein the cathode electrode and the anode electrode are at least partially exposed, and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode electrode and anode electrode; an energy storage unit; and a radio emitting device, wherein the photovoltaic powered flexible electronic device comprises a minimum bend radius ranging from 1 mm to 100 mm.

Certain embodiments of the present disclosure are directed to an organic photovoltaic powered flexible electronic device comprising a flexible organic photovoltaic module, a cathode electrode and a anode electrode incorporated into the flexible organic photovoltaic module, wherein the cathode electrode and the anode electrode are at least partially exposed, and a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode electrode and anode electrode; an energy storage unit; and a radio emitting device, wherein the photovoltaic powered flexible electronic device comprises a Young's Modulus of 150 GPa or less.

Other embodiments of the present disclosure are directed to an organic photovoltaic powered flexible electronic device comprising a flexible organic photovoltaic module, a cathode electrode and a anode electrode incorporated into the flexible organic photovoltaic module, wherein the cathode electrode and the anode electrode are at least partially exposed, and a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode electrode and anode electrode; an energy storage unit; and a radio emitting device, wherein the organic photovoltaic powered flexible electronic device comprises a minimum bend radius ranging from 1 mm to 100 mm.

Certain embodiments of the present disclosure are directed to a photovoltaic powered flexible electronic device comprising a flexible photovoltaic module; a cathode electrode and a anode electrode incorporated into the flexible photovoltaic module, wherein the cathode electrode and the anode electrode are at least partially exposed; and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode electrode and anode electrode; an energy storage unit; and a power supply connector, wherein the photovoltaic powered flexible electronic device comprises a Young's Modulus of 150 GPa or less.

Other embodiments of the present disclosure are directed to a photovoltaic powered flexible electronic device comprising a flexible photovoltaic module; a cathode electrode and a anode electrode incorporated into the flexible photovoltaic module, wherein the cathode electrode and the anode electrode are at least partially exposed; and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit, wherein the recharging circuit is electrically connected to the cathode electrode and anode electrode; an energy storage unit; and a power supply connector, wherein the photovoltaic powered flexible electronic device comprises a minimum bend radius ranging from 1 mm to 100 mm.

Further embodiments of the present disclosure are directed to an organic photovoltaic powered flexible electronic device comprising a flexible organic photovoltaic module; a cathode electrode and a anode electrode incorporated into the flexible organic photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode electrode and anode electrode; an energy storage unit; and a power supply connector, wherein the organic photovoltaic powered flexible electronic device comprises a Young's Modulus of 150 GPa or less.

Additional embodiments of the present disclosure are directed to an organic photovoltaic powered flexible electronic device comprising a flexible organic photovoltaic module; a cathode electrode and a anode electrode incorporated into the flexible organic photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit, wherein the recharging circuit is electrically connected to the cathode electrode and anode electrode; an energy storage unit; and a power supply connector, wherein the organic photovoltaic powered flexible electronic device comprises a minimum bend radius ranging from 1 mm to 100 mm.

Additional embodiments of the present disclosure are directed to a device comprising a flexible photovoltaic module; a cathode electrode and a anode electrode incorporated into the flexible photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit comprising a power management device, wherein the recharging circuit is electrically connected to the cathode electrode and anode electrode; an energy storage unit; and a power supply connector, wherein the organic photovoltaic powered flexible electronic device comprises a Young's Modulus of 150 GPa or less. In certain of these embodiments, the flexible photovoltaic module is a flexible organic photovoltaic module.

Additional embodiments of the present disclosure are directed to a device comprising a flexible photovoltaic module; a cathode electrode and a anode electrode incorporated into the flexible photovoltaic module, wherein the cathode electrode and the anode electrode are at least partially exposed; a flexible circuit board, wherein the flexible circuit board is attached to one of the following: (a) the flexible organic photovoltaic module, (b) a flexible substrate located on the flexible organic photovoltaic module, and (c) an adhesive located on the flexible organic photovoltaic module, the flexible circuit board comprising: a recharging circuit comprising a power management device, wherein the recharging circuit is electrically connected to the cathode electrode and anode electrode; an energy storage unit; and a power supply connector, wherein the organic photovoltaic powered flexible electronic device comprises a minimum bend radius ranging from 1 mm to 100 mm. In certain of these embodiments, the flexible photovoltaic module is a flexible organic photovoltaic module.

The flexible electronic devices according to the present disclosure all comprise a flexible photovoltaic module. In some embodiments, the flexible photovoltaic module of the present disclosure is comprised of organic photovoltaic (OPV) cells, III-V photovoltaics (including, but not limited to, gallium arsenide (GaAs), gallium indium phosphide (GaInP), gallium aluminum arsenide (GaAlAs)), silicon, cadmium telluride (CdTe), copper indium gallium selenide (CIGS), quantum dots (QD), copper zinc tin sulfide (CZTS), dye synthesized solar cells (DSSC), nanocrystal solar cells, and/or perovskites photovoltaic cells, or combinations thereof.

In certain embodiments, the flexible photovoltaic module of the present disclosure is comprised of OPV cells. In certain embodiments, the OPV cells comprise polymers and/or organic molecules (including pure carbon compounds) as the photo-active materials. Polymer-based and/or organic molecules based OPV modules can be solution-processed, requiring carrier solvents and methods such as but not limited to blade-coating, spin-coating, and printing. Some small molecule OPV modules can also be manufactured through vacuum deposition. Further embodiments of the present disclosure are directed to OPV modules manufactured using small molecule materials deposited via vacuum thermal evaporation, organic vapor jet printing, or organic vapor phase deposition. Manufacturing techniques for the OPV modules also include, for example, vacuum deposited, printed, and solution processed.

In certain embodiments, the organic films for the OPV module applications can be deposited by solution processing and/or vacuum deposition. Manufacturing methods include, but are not limited to, vacuum thermal evaporation, organic vapor phase deposition, organic vapor jet printing, atomic layer deposition, drop casting, blade coating, inkjet printing, slot-die coating, dip coating, bar coating, and spin coating. Polymers manufacturing may also include photo-crosslinking methods.

In any of the above-mentioned embodiments, the flexible electronic device can be used as a flexible smart label. In certain embodiments, the flexible smart label may comprise the flexible electronic device and an adhesive layer. In specific applications, the flexible smart labels may be shipping labels or product labels in stores, in which the smart labels are powered completely by the integrated photovoltaic module of the flexible electronic device. In these embodiments, the flexible smart labels may be attached to all surfaces, including curved or irregular surfaces.

In any of the above-mentioned embodiments, components of the flexible circuit board may be flexible hybrid electronics (FHEs). In certain embodiments, chips such as power management integrated circuits or radios may be designed as an FHE component such that the component itself is flexible.

In any of the above-mentioned embodiments, the photovoltaic powered flexible electronic devices according to the present disclosure can comprise one or more sensors. In certain embodiments, the sensor is configured to detect at least one environmental condition and when the environmental condition is detected, the radio emitting device produces a response. In further embodiments, the response is at least one of alerting a user, initiating an automated response, provide data analytics, and training a machine learning algorithm. In certain embodiments, the photovoltaic powered flexible electronic device is configured to train a machine learning model using data from the sensor.

In certain embodiments, the sensor a higher power sensor, which can be chosen from at least one of a gas sensor and a camera.

In certain embodiments of the present disclosure, the radio emitting device is configured to send data to a gateway device which receives the data. In further embodiments, the radio emitting device is configured to send data to a cloud device which receives the data. In additional embodiments, the radio emitting device is configured to be read using a device reader.

In certain embodiments, the radio emitting device is configured to not affect the bending radius of the photovoltaic powered flexible electronic device.

In certain embodiments, the flexible circuit board further comprises a resistor or integrated circuit configured to not affect the bending radius of the photovoltaic powered flexible electronic device.

The flexible electronic device disclosed herein can be used in a variety of applications. A list of non-limited examples is set forth in more detail below:

Agriculture, in which sensors can be used to monitor and automate growing conditions such as, for example, temperature, humidity, CO2, Lux, PAR (photosynthetic photon flux), soil moisture, soil pH, water pH, VPD (vapor pressure deficit), oxygen, dissolved oxygen, nutrients, and/or stem diameters;

Indoor farming, in which sensors can be used to monitor and automate growing conditions such as, for example, temperature, humidity, CO2, Lux, PAR, soil moisture, soil pH, water pH, VPD, oxygen, dissolved oxygen, nutrients, and/or stem diameters;

Ecology, in which sensors air temperature can be used to monitor soil moisture, and other climatological parameters such as, for example, 02, CO2, methane, etc., in order to generate integrated measurements of ecological phenomena, VPD, and/or TVOC (total volatile organic compounds);

Livestock tracking, in which a location tracking sensor and/or beacon such as, for example location (e.g., GPS, BLE trilateration, LoRa trilateration, ISM band trilateration) and/proximity (e.g., radio beacons, such as Bluetooth beacons, Thread beacons, Zigbee beacons, LoRa beacons, RFID beacons, active RFID beacons, etc.), can be placed on livestock to track motion, including whether the livestock is sick and not moving and/or if the livestock moves off the property;

Home/building automation and Internet of things, in which sensors can be used to monitor occupancy, temperature, light (intensity and/or color), motion, humidity, position (e.g. window open/closed), COx, fire, leak, moisture, and other sensors to trigger automation such as, for example, turning on or off lights, air conditioning, fans, heating, alarms, cameras, mobile alerts;

Recreation, in which sensors can be used to measure speed, rotation/swing speed, location, impact, pressure, acceleration, and/or concussion monitoring;

Wearable devices, in which sensors can be used to monitor temperature, pulse, altitude, body motion, biomechanical forces, injury detection, linear/rotational acceleration, impact forces, and inertial sensors;

Smartphones/tablets/computers/watches, in which sensors can be used to monitor temperature and/or humidity;

Jewelry, in which sensors and/or beacons can be used to monitor temperature, light, humidity, sound, motion, vibrations, location (e.g., GPS) and/proximity (e.g., BLE trilateration, LoRa trilateration, ISM band trilateration), and/or to send alerts/alarms (e.g. notify police/security services, medical emergency/medical services, other safety/help assistance alerts/alarms);

Energy infrastructure, in which sensors and/or beacons can be used to monitor methane and other gas sensors, location (e.g., GPS), and/proximity (e.g., BLE trilateration, LoRa trilateration, ISM band trilateration), and leak remedial action including, for example, leak detection with automation that turns fans on, closes pipes, sends alerts;

Medical monitoring devices and/or biomedical patches, in which sensors can be used to monitor heart rate, blood glucose, blood oxygen, insulin, body temperature, medical chemical detection, blood pressure, sleep monitoring, respiration rate, lactic acid, hydration, cholesterol, electrocardiogram, electroencephalogram, electromyogram, hemoglobin, and/or anemia;

Retail, in which sensors can be used to monitor temperature, humidity, location, light, proximity, and/or location of products being sold, and/or transmit data containing product specifications;

Cold chain, in which sensors and/or beacons can be used to monitor the cold transport of food, medical supplies/vaccines, by measuring temperature, humidity, light, proximity, location (e.g., GPS) and/proximity (e.g., BLE trilateration, LoRa trilateration, ISM band trilateration);

Food transport/packaging/storage/preparation/serving, in which sensors and/or beacons can be used to monitor temperature, humidity, light, proximity, location (e.g., GPS) and/proximity (e.g., BLE trilateration, LoRa trilateration, ISM band trilateration);

Air/land/water transportation, in which sensors can be used to monitor temperature and/or leaks;

Remote field sensing, in which sensors can be used in the field to monitor wildlife activity and unauthorized entry;

Modular power harvesting and/or radio device, in which sensors can be used to provide power and communication capabilities;

Building/home monitoring, in which sensors can be used to monitor occupancy, temperature, humidity, light levels, proximity, air quality, integrated with smart building/home automation;

Tamper resistant monitoring, in which sensors and/or beacons can be used to make sure boxes do not open during shipment by placing a stretch sensor on the box, possibly with a drop and GPS sensor;

Alert systems, in which sensors can be used to trigger an alarm system and or send alerts such as, for example email messages, text messages, SMS (short message service) and automated calls upon certain events occurring;

Automation, in which sensors can trigger automation and alerts, from any of the sensors listed here including, for example, climate control for agriculture, or turning fans on if a methane leak is detected;

Automotive, in which sensors can be used to monitor the internal and external operating conditions of the vehicle;

Building integrated/applied/attached photovoltaics, in which sensors can be used to integrate/apply/attach to flexible photovoltaics on a building with integrated electronics, sensors, radios;

Aerospace, in which sensors can be used to measuring inertia, acceleration, speed/velocity, location and/or pressure;

Shipping/logistics, in which sensors and/or beacons can be used to monitor, drop, acceleration, temperature/humidity (food tracking), stretch (in order to make sure package was not opened during shipping), location (e.g., GPS) and/proximity (e.g., BLE trilateration, LoRa trilateration, ISM band trilateration);

Asset tracking, in which sensors and/or beacons can be used to monitor location (e.g., GPS) and/or proximity (e.g., BLE trilateration, LoRa trilateration, ISM band trilateration) and/or measure temperature, humidity, and/or acceleration;

Location/movement/vibration monitoring, in which sensors can be used for asset tracking and to measure for drop events (for example, shipping electronics and fragile items);

Architecture, in which sensors can be used to monitor conditions, such as light, temperature and/or humidity and control automation, such as motion-activated lighting; and Military/Defense and surveillance, in which sensors can be used to monitor asset tracking, temperature/humidity/location/vibration/acceleration, laser activity and weather.

In certain embodiments, the flexible photovoltaic module contained in the flexible electronic device is one or more of semi-transparent, highly reflective, or opaque.

The photovoltaic module can be made from any combination of series and/or parallel photovoltaic cells, which are arranged to produce the required voltage and current combinations for the electronics device.

In certain embodiments, the flexible photovoltaic module contained in the flexible electronic device comprises photovoltaic cells which comprise one of more junctions disposed sequentially.

In certain embodiments, the flexible photovoltaic module contained in the flexible electronic device comprises photo-active materials, the photo-active materials comprising polymers, organic molecules (including pure carbon compounds), or both polymers and organic molecules.

In certain embodiments, the flexible photovoltaic module contained in the flexible electronic device is optimizable for levels of light, the levels of light ranging from 1 lux to 150,000 lux, by one or more of modifying the color of the cell, modifying the transparency of the cell, adding anti-reflective coatings, adding distributed Bragg reflectors, adding micro-patterning, adding a light-trapping structure, modifying the bandgap, adding junctions, and adding elements. In certain embodiments, the optimizable levels of light can range from 1 lux to 100 lux, from 100 lux to 1,000 lux, from 1,000 lux to 10,000 lux, from 500 lux to 2,000 lux from 1,000 lux to 50,000 lux, from 10,000 lux to 50,000 lux, from 50,000 lux to 140,000 lux, and from 100,000 lux to 130,000 lux.

In certain embodiments, the flexible photovoltaic module contained in the flexible electronic device comprises one or more of anti-reflection coatings, ultra-violet protection layers, superlattices, Bragg reflector, infrared reflective layers, ceramics layers, oxide layers, metal oxide layers, micropatterned layers, quantum dots, growth buffers, cap layers, and metamorphic layers.

In certain embodiments, the flexible substrate contained in the flexible electronic device comprises one or more materials chosen from polymers, thermoplastics, composite films, multilayered films, willow glass, acrylic, metal foils, metal alloy foils, paper, fabrics, and textiles.

In certain embodiments, the flexible electronic devices further comprise other small components that do not detract from the overall flexibility of the flexible electronic device. For example, the flexible electronic devices may further comprise small resistors commonly used today, such as those used in automotive applications, but which are not considered die components.

In certain embodiments, the flexible electronic devices according to the present disclosure comprise flexible printed electronics and die components.

In other embodiments, the flexible electronic devices further comprise small components that may be rigid locally but does not affect the overall bend radius of the flexible electronic device. For example, an integrated circuit chip, radio module, or power management integrated circuit chip, or small coin cell battery may be integrated.

In certain embodiments, the flexible electronic devices according to the present disclosure are printed electronic devices comprising conductive traces. These conductive traces can also be included in non-limiting and conventional manners. In certain embodiments, the conductive traces can be printed, screen-printed and/or deposited, or the conductive traces can be solder connections.

In certain embodiments, a flexible printed circuit board (FPCB) is used, comprising etched copper or laminated foil traces. A flexible electronic device from FPCB may comprise one of more of: flexible printed electronics, die components, small components that do not detract from the overall flexibility of the flexible electronic device, small components that may be rigid locally but does not affect the overall bend radius of the flexible electronic device.

In certain embodiments, the flexible electronic device comprises one or more sensors. Non-limiting examples of sensors include sensors for humidity, CO2, light level, vapor pressure deficit, heat index, water, pH, soil moisture, volumetric soil moisture content, soil pH, accelerometer, temperature, pressure, gas sensing, global positioning system (GPS), ultra-wide band (UWB), trilateration, parametric sensing, CO, oxygen, total volatile organic compounds, chemical, contaminants, conductivity, resistivity, current sensing, current measuring, electrical activity, metal detecting, evapotranspiration, water usage, salinity, pest control, climate monitoring, stem diameters, radiation, rain, snow, wind, lightning, soil nutrients, occupancy, position, status, smoke, fluid leaks, power failure, total dissolved solids, flood, motion, door motion, window motion, photogate, touch, Haptic, displacement level, acoustic frequency, sound frequency, vibration frequency, air flow, Hall effect, fuel level, fluid level, radar, torque, speed, tire pressure, chemicals, infrared, ozone, magnetic, radio direction finder, air pollution, moisture detection, seismometer, airspeed, depth, altimeter, freefall, position, angular rate, shock, tilt, velocity, inertial, force, stress, strain, weight, flame, proximity, presence, stretch, heartbeat, heart rate, blood glucose, blood oxygen, insulin, body temperature, medical chemical detection, blood pressure, sleep monitoring, respiration rate, lactic acid, hydration, cholesterol, electrocardiogram, electroencephalogram, electromyogram, hemoglobin, and anemia In certain embodiments, the flexible electronic device comprises one or more radios, Non-limiting examples of radios include Bluetooth, Bluetooth Low Energy (BLE), Zigbee, Thread, long-term evolution (LTE) or cellular, 4G/5G/6G cellular, wireless fidelity (Wi-Fi) or IEEE 802.11, long range (LoRa), ultra-wideband (UWB), infrared (IR), radio frequency identification (RFID), active radio frequency identification (ARFID), or other industrial, scientific, and medical band (ISM-band) radios.

In certain embodiments, the flexible electronic device comprises one or more of batteries, supercapacitors, thermoelectric devices, light-emitting devices, LEDs, power management chips, logic circuits, microprocessors, microcontrollers, integrated circuits, resistors, capacitors, transistors, inductors, diodes, semiconductors, optoelectronic devices, memristors, micro-electromechanical systems (MEMS) devices, varistors, antennas, transducers, crystals, resonators, terminals, optical detectors, optical emitters, heaters, circuit breakers, fuses, relays, spark gaps, heat sinks, motors, displays, liquid crystal displays (LCD), light-emitting diode displays (LED), microLED, electroluminescent displays (ELD), electrophoretic displays, active matrix organic light-emitting diode displays (AMOLED), organic light-emitting diode displays (OLED), quantum dot displays (QD), quantum light-emitting diode displays (QLED), vacuum florescent displays (VFD), digital light processing displays (DLP), interferometric modulator displays (IMOD), digital microshutter displays (DMS), plasma displays, neon displays, filament displays, surface-conduction electron-emitter displays (SED), field emission displays (FED), Laser TV, carbon nanotube displays, touch screens, external connectors, data storage, piezo devices, speakers, microphones, security chips, and user input controls including buttons, knobs, sliders, switches, joysticks, directional-pads, keypads, and pressure/touch sensors, etc.

In certain embodiments, electrical contact contained in the flexible electronic device is established through the use of one or more of the following: soldering, ultrasonic soldering, conductive epoxy, conductive paste, conductive paints, spot welding, welding, wire bonding, printed conductive inks, mechanical contact, nanowire meshes, graphene, and graphite.

In certain embodiments, electrical contact contained in the flexible electronic device is established via printed conductive inks or epoxies in contact with bus bars or exposed contacts in the flexible photovoltaic module. In further embodiments, the bus bars or contacts can comprise a combination of vacuum deposited metals and ultrasonic soldered bus bars.

In additional embodiments, a process for manufacturing the photovoltaic modules in the flexible electronic device comprises one or more of solution processing, vacuum deposition, photo-crosslinking, vacuum thermal evaporation, organic vapor phase deposition, organic vapor jet printing, atomic layer deposition, drop casting, blade coating, inkjet printing, slot-die coating, dip coating, bar coating, dye synthetization, and spin coating. In further embodiments, the process for manufacturing the OPV modules comprises one or more of a batch or roll-to-roll manufacturing process wherein the flexible electronic device is attached directly to the OPV module or laminated to the OPV module using heat or adhesives.

In some embodiments, the flexible photovoltaic module is attached directly to the flexible circuit board. The flexible photovoltaic module may comprise an active photovoltaic layer at least partially surrounded by a cover layer or encapsulation material. In certain embodiments, the flexible photovoltaic module is attached to a flexible substrate and the flexible substrate is attached to the flexible circuit board. In some embodiments, the flexible photovoltaic module is attached to an adhesive and the adhesive is attached to the flexible circuit board.

In certain embodiments, the flexible electronic devices disclosed herein are used in agriculture, in which sensors can be used to monitor and automate growing conditions such as, for example, temperature, humidity, $CO_2$, Lux, PAR (photosynthetic photon flux), soil moisture, soil nutrients, dissolved nutrients, soil pH, water pH, VPD (vapor pressure deficit), oxygen, dissolved oxygen, electrical conductivity, water runoff, and/or stem diameters. In further embodiments, the flexible electronic devices disclosed herein are used in indoor farming, in which sensors can be used to monitor and automate growing conditions such as, for example, temperature, humidity, $CO_2$, Lux, PAR, soil moisture, soil nutrients, dissolved nutrients, soil pH, water pH, VPD, oxygen, dissolved oxygen, electrical conductivity, water runoff, and/or stem diameters.

In certain embodiments, the flexible electronic device contains a camera used to monitor crops, which can be analyzed using Artificial Intelligence (AI) to determine the health of the crop and provide predictive analytics of crop yield and updates to environmental conditions that can improve crop yield.

In other embodiments, the flexible electronic devices disclosed herein are used in livestock tracking, in which a location tracking sensor and/or beacon such as, for example, location (e.g., GPS) and/proximity (e.g., BLE trilateration, LoRa trilateration, ISM band trilateration), can be placed on livestock to track motion. This tracking allows the user to determine whether the livestock is sick and not moving and/or if the livestock moves off the property.

In other embodiments, the flexible electronic devices disclosed herein are used in building/home automation and Internet of things applications, in which sensors can be used to monitor temperature, light (intensity and/or color), motion, humidity, position (e.g. window open/closed), $CO_x$, fire, leak, moisture, and other sensors to trigger and automated task such as, for example, turning on or off lights, air conditioning, fans, heating, alarms, cameras and/or mobile alerts, etc.

In additional embodiments, the flexible electronic devices disclosed herein are used in cold chain management, in which sensors and/or beacons can be used to monitor the cold transport of food, medical supplies/vaccines, etc., by measuring temperature, humidity, light, location (e.g., GPS) and/proximity (e.g., BLE trilateration, LoRa trilateration, ISM band trilateration).

Further embodiments use the flexible electronic devices disclosed in food transport/packaging/storage/preparation/serving, in which sensors and/or beacons can be used to monitor temperature, humidity, light, location (e.g., GPS) and/proximity (e.g., BLE trilateration, LoRa trilateration, ISM band trilateration).

Additional embodiment of the present disclosure uses sensors and/or beacons disclosed herein to monitor temperature, humidity, light levels, proximity, etc., integrated with smart building/home automation. In addition, the present disclosure contemplates the disclosed sensors triggering automation and alerts, from any of the sensors listed here including, for example, climate control for agriculture, or turning fans on if a methane leak is detected.

Further, the disclosed flexible electronic devices can be used in shipping and logistics applications in order to monitor GPS location, drop, acceleration, temperature/humidity (food tracking), proximity (e.g., BLE beacons or trilateration) and/or stretch (in order to make sure package was not opened during shipping.

Moreover, the disclosed flexible electronic devices can be used in asset tracking, in which sensors and/or beacons can be used to monitor location (e.g., GPS) and/proximity (e.g., BLE trilateration, LoRa trilateration, ISM band trilateration).

In some embodiments, the beacon does not contain any sensors. The beacon is received by a radio receiving device that determines where sensors are located, either through proximity or triangulation.

Depending on application specifications, the photovoltaic modules can be manufactured to be semi-transparent, highly reflective, or opaque. Semi-transparent photovoltaic modules can be achieved through using semi-transparent conductive materials (such as indium tin oxide or thin metal) for both cathode and anode electrodes. Reflectivity and hue can be controlled via organic material selection and thickness of the organic layers in the photovoltaic module.

In certain embodiments, the photovoltaic module is flexible with a low stiffness<100 N/m that contain, but not limited to, materials with Young's modulus<150 GPa. Non-limiting examples of the Young's modulus ranges include from 2 GPa to 40 GPa, 2 GPa to 30 GPa, 2 GPa to 20 GPa, 2 GPa to 10 GPa, 2 GPa to 6 GPa, 2 GPa to 4 GPa, 50 GPa to 100 GPa, 50 GPa to 90 GPa, 50 GPa to 80 GPa, 50 GPa to 70 GPa, 60 GPa to 100 GPa, 60 GPa to 90 GPa, 60 GPa to 80 GPa, 70 GPa to 100 GPa, and 70 GPa to 90 GPa. In certain embodiments, the Young's Modulus may range from 2 GPa to 4 GPa. In other embodiments, the Young's Modulus may range from about 70 GPa to about 90 GPa.

In some embodiments flexible photovoltaic modules may be disposed onto flexible substrate such as but not limited to polymers/thermoplastics (for example, polyimide and polyester films, polyethylene terephthalate, polypropylene, polycarbonate), composite/multilayered films, willow glass, acrylic, metal/metal alloy foils, paper, fabrics/textiles.

The photovoltaic modules may be optimized for any light spectrum, such as sunlight or indoor light, for example, LED (light-emitting diode), fluorescent, incandescent, grow lights, neon lights, mercury vapor, metal halide, high-intensity discharge, bioluminescent, and chemiluminescent, to increase the energy harvesting from photovoltaic for a target spectrum. For a given light spectrum, the optimization could target a specific level of light, ranging from 1 lux to 150,000 lux. Non-limiting exemplary ranges of optimized levels of light include, for example: 100 lux to 1,000 lux for indoor applications using artificial light sources; 100 lux to 75.00 lux for growth house applications, such as 5,000 lux to 7,000 lux for seedlings and 15,000 lux to 75,000 lux for vegetative growth; 1,000 lux to 30,000 lux for cloudy outside applications, and 100,000 lux to 140,000 lux for bright sunlight applications.

In certain embodiments, the photovoltaic modules can be optimized for artificial light sources in order to harvest most light in the low-light environments. In such embodiments, there will be enough light to power the device when brought outside even though the photovoltaic module is not optimized for outdoor light.

For example, OPV modules can be highly tunable to the light spectrum in varying applications. Internally, color and transparency of OPVs can be tuned by increasing or decreasing device layers thicknesses, choosing photoactive materials based on their spectral absorption properties, and varying the ratio of photoactive materials, adding/removing layers and/or junctions. Eternally, the OPV modules can be tuned to a specific light spectrum using anti-reflective coatings, distributed Bragg reflectors, micro-patterning, and other light-trapping structures.

In general, photovoltaic cells are engineered such that their absorption spectrum will accept the emission spectrum of the light source. Tuning can occur by varying the bandgap of an individual junction (or sub-cell), or by adding multiple junctions (or sub-cells) to the devices such that the combined absorption spectrum of the photovoltaic cell is matched to the light source—thereby increasing the photovoltaic efficiency. For example, elements can be added to the base photovoltaic cell (e.g., adding N to GaAs, etc.) to adjust the bandgap.

In some embodiments, the photovoltaic modules can be fabricated in custom shapes to serve functional and/or aesthetic purpose. The substrate, the photovoltaic modules, and electronics device can be any shape including, but not limited to a polygon, a circle, or any shape made from combinations of straight and curved edges. In certain embodiments, the substrate, the photovoltaic modules, and electronics device can be squares and rectangles for use as a flexible electronic device.

In some embodiments, additional layers may be disposed on the photovoltaic module to enhance its performance, lifetime, manufacturability, aesthetics, and/or add functionality. These layers may be semiconductor, metal, dielectric, and/or insulating layers. In some embodiments, the additional layers to the photovoltaic module may include, but are not limited to, anti-reflection coatings, UV (ultra-violet) protection layers, superlattices, Bragg reflector, IR (infrared) reflective layer, ceramics layers, oxide layers, metal oxide layers, micropatterned layers, quantum dots, growth buffer and cap layers, and metamorphic layers.

In some embodiments, the electronics device will be a sensor to monitor conditions such as but not limited to humidity, CO2, light level, vapor pressure deficit, heat index, water pH, soil moisture, volumetric soil moisture content, soil pH, accelerometer, temperature, pressure, gas sensing, GPS, UWB (ultra-wide band) trilateration, parametric sensing, CO, oxygen, dissolved oxygen, total volatile organic compounds, chemical, contaminants, conductivity, electrical conductivity, resistivity, current sensing/measuring, electrical activity, metal detecting, evapotranspiration, water usage, salinity, pest control, climate monitoring, stem diameters, radiation, rain, water runoff, snow, wind, lightning, soil nutrients, dissolved nutrients, occupancy, position/status, smoke, fluid leaks, power failure, total dissolved solids, flood, motion, door/window motion, photogate, touch, Haptic, displacement, level, acoustic/sound/vibration/frequency, air flow, Hall effect, fuel level, fluid level, radar, torque, speed, tire pressure, chemicals, infrared, ozone, magnetic, radio direction finder, air pollution, moisture detection, seismometer, airspeed, depth, altimeter, freefall, position, angular rate, shock, tilt, velocity, inertial, force, stress, strain, weight, flame, proximity/presence, stretch, heartbeat, heart rate, blood glucose, blood oxygen, insulin, body temperature, medical chemical detection, blood pressure, sleep monitoring, respiration rate, lactic acid, hydration, cholesterol, electrocardiogram, electroencephalogram, electromyogram, hemoglobin, and anemia.

In certain embodiments of the present disclosure, the overall device may comprise one or more sensors, a radio (such as, for example, Bluetooth, BLE, Zigbee, Thread, active RFID, LoRa, or LTE), the required circuitry (for example an integrated circuit chip or a power management chip) and firmware.

In other embodiments, the overall device may comprise a radio such as but not limited to Bluetooth, BLE, Zigbee, Thread, LTE or cellular, Wi-Fi or IEEE 802.11, LoRa, UWB, IR, RFID (radio frequency identification) or other ISM-band (industrial, scientific, and medical) radios. Different radios are used for different applications. For example, some radios are short range and require lower power, with other radios are longer range and require more power. In certain embodiments directed to indoor applications, low power radios such as Bluetooth, BLE, Zigbee, or Thread are used where the signal range is not long within a building. In other embodiments directed to outdoor applications, higher-power long-range radios such as LoRa radio for farms, or LTE for moving vehicles are used.

In other embodiments, the electronics devices may attach the following components to the backside of the photovoltaic enabled by the exposed photovoltaic contacts: batteries, supercapacitors, fuel cells, thermoelectric device, light-emitting devices, LEDs, power management chips, logic circuits, microprocessors, microcontroller, integrated circuits, resistors, capacitors, transistors, inductors, diodes, semiconductors, optoelectronic devices, memristor, MEMS (micro-electromechanical systems) device, varistor, antennas, transducers, crystals, resonators, terminals, vacuum tubes, optical detectors/emitters, heaters, circuit breaker, fuse, relay, spark gap, heat sink, motor, displays (such as but not limited to LCD (liquid crystal display), LED (light emitting diode), microLED, ELD (electroluminescent display), electrophoretic display, AMOLED (active matrix organic light-emitting diode), OLED (organic light-emitting diode), QD (quantum dot), QLED (quantum light-emitting diode), CRT (cathode ray tube), VFD (vacuum florescent display), DLP (digital light processing), IMOD (interferometric modulator display), DMS (digital microshutter display), plasma, neon, filament), SED (surface-conduction electron-emitter display), FED (field emission display), Laser TV, carbon nanotubes touch screens, external connectors, data storage, piezo devices, speakers, microphones, security chips, and user input controls such as but not limited to buttons, knobs, sliders, switches, joystick, directional-pads, keypad, and pressure/touch sensor.

Lamination may include but is not limited to plastics, glass, metals, silicones, elastomers. Lamination can be achieved, for example but not limited to, thermal/pressure/vacuum lamination, UV curing, vacuum lamination, flame lamination, hot melt lamination, extrusion lamination, dry-bond lamination, wet-bond lamination, and solventless lamination.

Potting/conformal coating may include but is not limited to urethane, parylene, polymers, resins, epoxies, acrylic, paints, tapes, fluorocarbon, nano coatings, hybrid coatings, water-based coating, UV cure coating.

Additional embodiments of the present disclosure are directed to a device comprising a flexible photovoltaic module; a cathode electrode and a anode electrode incorporated into the flexible photovoltaic module, wherein the cathode electrode and the anode electrode are at least partially exposed; an adhesive disposed on the flexible photovoltaic module; and a flexible circuit board disposed on the adhesive, the flexible circuit board comprising: a recharging circuit comprising a power management device, wherein the recharging circuit is electrically connected to the cathode electrode and anode electrode; an energy storage unit; and a power supply connector.

In further embodiments, at least one of the substrate, the photovoltaic module, and the electronics device is rigid. In additional embodiments, at least one of the substrate, the photovoltaic module, and the flexible electronic device is flexible. In the flexible sensors and flexible electronic devices disclosed herein, it is also contemplated that there may be small rigid components, such as sensors, chips, and die components, that are comprised on the flexible substrate.

In any of the above-mentioned embodiments of flexible electronic devices, the energy storage unit may comprise a primary/secondary battery and/or capacitor, or any combination of batteries and/or capacitors. In certain embodiments, the capacitor may be a supercapacitor.

In any of the above-mentioned embodiments of flexible electronic devices, the energy storage unit can be electrically connected to the recharging circuit.

In certain embodiments, the power supply connector comprises at least one of contacts, leads, and external connectors electronically connected to the recharging circuit.

In certain embodiments, the power supply connector sends data for state of charge or a voltage of the energy storage unit or other data related to the energy storage unit status/condition.

In certain embodiments, the data for state of charge or voltage or other condition of the energy storage unit is transmitted over an I2C communication protocol.

In other embodiments, the data for state of charge or voltage or other condition of the energy storage unit is transmitted as an analog voltage signal.

In certain embodiments, a product marking is located on a surface or embedded within the photovoltaic powered flexible electronic device.

In certain embodiments, the product marking is embedded within the adhesive.

In certain embodiments, the product marking is located on a front or back of the photovoltaic powered flexible electronic device.

In certain embodiments, the product marking is located on a non-illuminated side of photovoltaic module and the photovoltaic module is sufficiently transparent such that the product marking is visible through the photovoltaic powered flexible electronic device.

In any of the above-mentioned embodiments of flexible electronic devices, the flexible circuit board further can comprise a resistor or integrated circuit configured to not affect the bending radius of the photovoltaic powered flexible electronic device.

FIG. 1 is an illustration of the photovoltaic powered flexible electronic device in some embodiments. In this figure, product markings are depicted as being printed directly on the front of the flexible electronic device.

In some embodiments, the photovoltaic powered flexible electronic device may be used as a flexible smart label or a stick-and-place device. In some embodiments, the flexible smart label includes an adhesive layer 120 attached to the photovoltaic powered flexible electronic device 110. The stick-and-place device may be attached to any surface such as but not limited to a shipping package, shipping pallet, truck or delivery vehicle, wall, furniture, lighting fixture, building interior, building exterior, window, pipeline or supporting infrastructure, HVAC unit, appliance, or door.

The stick-and-place device can be attached as shipping labels, or as stand-alone sensors in addition to shipping labels, to shipping containers/packages, e.g. to monitor shipping conditions (such as but not limited to temperature, humidity, proximity location, GPS, drop force, acceleration, and lux).

The photovoltaic powered flexible electronic device may further comprise a product marking 112 printed directly on a front, middle, or back of the stick-and-place device. Product markings 112 may comprise barcodes, text, QR codes, insignia, symbols, pictures or combinations thereof.

In some embodiments, a product marking 112 is added by the manufacturer of the photovoltaic powered flexible electronic device 110. The manufacturer can add the product marking 112 on the front and/or back sides of photovoltaic powered flexible electronic device 110, the product markings 112 can be added on the inner and/or outer surfaces of the device. The product marking 112 can be created, for example, through methods including but not limited to printing, etching, laser scribing, stamping, depositing other materials that create contrast to the color of the device, and/or using other methods.

The manufacturer could also add product markings 112 to a photovoltaic substrate using any of these methods before fabricating or deposition of the photovoltaic device, such that the product markings 112 are between the photovoltaic substrate and photovoltaic components/layers/stack. Also, the product markings 112 can be added on the non-illuminated side of photovoltaic components/layers/stack, but the photovoltaic is sufficiently transparent such that the product markings 112 are visible through the photovoltaic stack.

The manufacturer could also add product marking 112 to a photovoltaic encapsulation, and subsequently encapsulate the photovoltaic components/layers/stack after device fabrication such that the product marking is visible on top of the photovoltaic stack.

In other embodiments, the manufacturer adds a product marking 112 on the exterior of the flexible electronic device after fabrication of the photovoltaic and/or flexible electronic device 110.

The product marking 112 can be created, for example, through methods including but not limited to printing, etching, laser scribing, stamping, depositing other materials that create contrast to the color of the device, and/or using other methods.

In other embodiments, the customer or end user adds product marking 112 on the exterior of the flexible electronic device.

The product marking 112 can be created, for example, through methods including but not limited to printing, etching, laser scribing, stamping, depositing other materials that create contrast to the color of the device, and/or using other methods.

In some embodiments, the flexible electronic device includes a flexible photovoltaic module. The flexible photovoltaic module may include photovoltaic cells comprising a material selected from the group consisting of organic photovoltaic (OPV) cells, III-Vs (such as but not limited to gallium arsenide (GaAs), gallium indium phosphide (GaInP), gallium aluminum arsenide (GaAlAs)), silicon, cadmium telluride (CdTe), copper indium gallium selenide (GIGS), copper indium selenide (CIS), copper zinc tin sulfide (CZTS), quantum dots (QD), copper zinc tin sulfide (CZTS), dye synthesized solar cells (DSSC), nanocrystal solar cells, perovskites, or combinations thereof.

Photovoltaic module may consist of organic photovoltaic (OPV) cells, III-Vs (such as but not limited to gallium arsenide (GaAs), gallium indium phosphide (GaInP), gallium aluminum arsenide (GaAlAs)), silicon, cadmium telluride (CdTe), copper indium gallium selenide (CIGS), quantum dots (QD), copper zinc tin sulfide (CZTS), dye synthesized solar cells (DSSC), nanocrystal solar cells, and/or perovskites photovoltaic cells, or combinations thereof.

In some embodiments, the photovoltaic device is comprised of organic photovoltaics. Organic photovoltaic cells have many potential advantages due to their nontoxic nature, relatively small energy investment for fabrication, conformability to non-planar surfaces, and compatibility with large-area, high-throughput manufacturing processes. In some embodiments, OPV modules may be manufactured to be semi-transparent, highly reflective, or opaque. Semi-transparent OPV modules may be achieved through using semi-transparent conductive materials, such as indium tin oxide or thin metal, for both cathode and anode electrodes. Reflectivity and hue may be controlled via organic material selection and thickness of the organic layers in the OPV module. OPV modules may contain polymers and/or organic molecules (including pure carbon compounds) as photo-active materials. Polymer-based and/or organic-molecule-based OPV modules may be solution-processed, requiring carrier solvents and manufacturing methods such as, but not limited to, blade coating, spin coating, and printing. Some small molecule OPV modules may also be manufactured through vacuum deposition. In some embodiments, OPV module manufacturing may involve small molecule materials deposited via vacuum thermal evaporation, organic vapor jet printing, or organic vapor phase deposition. Other manufacturing methods may include, atomic layer deposition, drop casting, inkjet printing, slot-die coating, dip coating, bar coating, and photo-crosslinking.

In some embodiments, the photovoltaic module is a front face of the flexible electronic device. The photovoltaic module may be produced in different colors to increase the aesthetic appeal of the product and/or to absorb light of any illumination source. For example, photovoltaic module may be tuned to produce colors such as but not limited to grey, brown, black, purple, blue, green, red, etc.

In some embodiments, the flexible electronic device may range in size from 1 cm×1 cm to 30 cm×30 cm. In some embodiments, the flexible electronic device is business-card sized, such as 90 mm×50 mm. In other embodiments, the flexible electronic device is sized for a shipping label or similarly sized device, which can be a variety of sizes tailed to specific applications. For example, the size of the flexible electronic device may be 100 mm×150 mm, 100 mm×140 mm, 100 mm×130 mm, 100 mm×120 mm, 100 mm×110 mm, 100 mm×100 mm, 200 mm×140 mm, 150 mm×210 mm, 200 mm×290 mm, 210 mm×300 mm, 60 mm×40 mm, 100 mm, ×40 mm, 40 mm×20 mm, 100 mm×50 mm, 130 mm×60 mm, 46 mm×25 mm, 100 mm×70 mm, 120 mm×164 mm, 45 mm×110 mm, or 45 mm×85 mm, etc.

In other embodiments, the flexible electronic device is sized for a sensor or power source device. For example, the flexible electronic device may be 90×82 mm, 70 mm×70 mm, or 80 mm×90 mm. The flexible electronic device could also be sized as a business card or shipping label, with any of the dimensions listed above.

In some embodiments, the flexible electronic device may comprise a minimum bend radius of at least 100 mm and in certain embodiments can range from 1 mm to 100 mm. In some embodiments, the minimum bend radius is at least 90 mm, at least 85 mm, at least 80 mm, at least 75 mm, at least 70 mm, at least 65 mm, at least 60 mm, at least 55 mm, at least 50 mm, at least 45 mm, at least 40 mm, at least 35 mm, at least 30 mm, at least 25 mm, at least 20 mm, at least 15 mm, at least 10 mm, at least 5 mm, at least 3 mm, or at least 1 mm.

In some embodiments, the flexible electronic device may have a thickness ranging from 0.1 mm to about 10 mm. In some embodiments, the device thickness is 1 mm, 1.1 mm, 1.2 mm, 1.5 mm, 1.6 mm, 2 mm, 2.5 mm, 3 mm, 3.5 mm, 4 mm, 5 mm, 7.5 mm or 9 mm.

In some embodiments, the flexible electronic device may have a weight ranging from 1 g to 100 g. In some embodiments, the weight is approximately 7 g, or approximately 11 g.

In some embodiments, the flexible electronic device may include an energy storage unit. The energy storage unit may be charged by the photovoltaic module. The energy storage unit may be a flexible or rigid component. In some embodiments, the rigid component may be comprised of several sub-components that do not affect the bending radius of the finished device.

The energy storage unit may enable a constant stream of power to other electronic components of the flexible electronic device, regardless of whether light is being absorbed by the flexible electronic device. In other words, the photovoltaic module opportunistically harvests energy when light is available and stores the excess in the energy storage unit.

In some embodiments, the flexible electronic device may include a recharging circuit. The recharging circuit may comprise a power management device. The recharging circuit may be electrically connected to the photovoltaic module and the energy storage unit. In some embodiments, the power management device may comprise a power management integrated circuit chip. In other embodiments, the power management device may be directly charged from and/or coupled to the photovoltaic module. In some embodiments, the power management device may be coupled to electrodes of the photovoltaic module.

In some embodiments, the flexible electronic device may further include additional components. For example, the flexible circuit board may comprise resistors, capacitors, inductors, fuses, transistors, diode, power management integrated circuits (PMICs), voltage regulators, boost converter, buck converter, or combinations thereof.

In some embodiments, components of the flexible circuit board are rigid but small enough such that they do not affect the bending radius of the finished device. In such an embodiment, small resistors, radios, or integrated circuits (such as power management integrated circuits) may be used.

In some embodiments, components of the flexible circuit board are bare die components which improve the bend radius of the flexible electronic device. The bend radius may be improved in some embodiments by decreasing the bend radius, thereby making the flexible circuit more flexible.

In some embodiments, components of the flexible circuit board are attached as a flexible electronics component. For example, chips such as power management integrated circuits or radios may be designed as an FHE component so that the component itself is flexible.

The flexible electronic device may include any combination of rigid components, bare die components, and flexible electronics components.

In some embodiments, the flexible electronic device forms an internet of things (IoT) node. In some embodiments, because the flexible electronic device has a higher energy budget than prior art smart labels (due to the photovoltaic harvesting), the flexible electronic device may be configured to: (a) more frequently communicate to the cloud or a data collection device; (b) longer ranged radio communications; (c) greater power electronics, such as gas sensors, cameras, and displays, (d) parallel collection of data from multiple devices and/or sensors; and/or (e) more frequent data collection.

In some embodiments, the flexible electronic device may facilitate artificial intelligence (AI) applications. As is well-known, machine learning training of AI applications requires a large collection of data. As mentioned, the higher energy budget of the flexible electronic device may increase data collection frequency, data communication frequency, and increased sensing options of the flexible electronic device. For example, AI could use multiple sensors to train the machine learning model and algorithms, and/or sensors can report more data because of their increased data collection frequency. Once the AI model is trained, the data collected from the flexible electronic devices can provide additional data for data processing/analytics, alerts/notifications, refinement of AI models, and/or additional machine learning training. In some embodiments, AI can use high-power sensing options such as cameras (e.g., visual, IR, etc.) which are made possible by the higher energy budget of the flexible electronic device.

Figure 2:
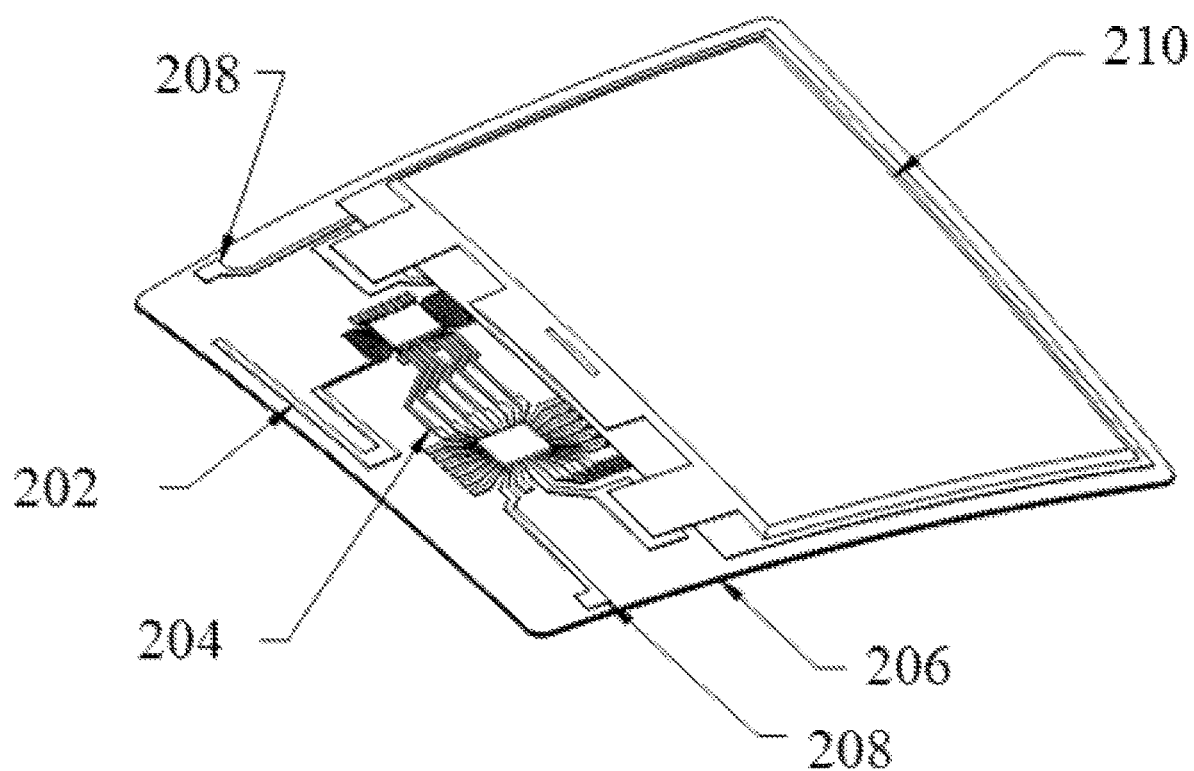
FIG. 2 is an illustration of one possible configuration of the backside of a photovoltaic powered flexible electronic device according to some embodiments of the present disclosure.

FIG. 2 is an illustration of the photovoltaic powered flexible electronic device according to some embodiments. This figure depicts one possible configuration of a flexible light-powered radio device as viewed from the back side. The radio 202 and power management circuits 204 are attached directly to the back side of a photovoltaic device and connected to its contacts 208. A flexible energy storage unit 210 is attached on the flexible electronics substrate 206 and connected to energy storage unit 210 contact pads on the circuit power management circuit 204.

In some embodiments, the photovoltaic powered flexible electronic device may comprise a radio emitting device 202. The flexible electronic device may or may not further include sensors. In this configuration the flexible electronic device may be configured as a complete and self-contained device. The flexible electronic device may be a smart label, which includes a stick-and-place-device as described above.

The radio emitting device 202 may be configured to send data. The data may be in the form of radio electromagnetic waves. The radio may be chosen from Bluetooth, Bluetooth Low Energy (BLE), Zigbee, Thread, long-term evolution (LTE) or cellular, 4G/5G/6G cellular, wireless fidelity (Wi-Fi) or IEEE 802.11, long range (LoRa), ultra-wideband (UWB), infrared (IR), radio frequency identification (RFID), active radio frequency identification (ARFID), or other industrial, scientific, and medical band (ISM-band) radios.

In some embodiments the data is sent over radio to a gateway device which receives the data, for example using Bluetooth, BLE, Zigbee, Thread, LoRa, or UWB. The gateway device can then send the data to the cloud, process the data locally on the gateway, or send the data to another computer device for processing.

In other embodiments the data is sent to the cloud without using a gateway device using LTE, 4G/5G/6G cellular, or Wi-Fi.

In other embodiments the device can be read using a device reader (e.g., a Bluetooth, BLE, ARFID, Zigbee, Thread, LoRa, UWB, or IR reader) which could be a handheld reader or mobile phone/tablet app.

In any of these cases, data can be sent to an application or to the cloud for data processing/analytics, alerts/notifications, and machine learning training.

In other instances the device is a sensor or a set of sensors which can monitor environmental conditions (such as any combination of the sensors disclosed above) which can be used to alert the user, initiate an automated response (such as but not limited to heating, ventilation and air conditioning or HVAC automation, lighting, shading, other types of environmental control automation), provide data analytics, or train a machine learning algorithm.

In some embodiments the flexible electronic device may constitute a proximity or asset tracking device that is located or triangulated by gateway(s) or radio receivers that monitor the proximity and/or location of the flexible electronic device(s). In such an embodiment, the flexible electronic device may not include a sensor.

In some embodiments the flexible electronic device may further comprise a sensor. The sensor may be any combination of the sensors disclosed above. In some embodiments, the sensor may monitor weather and/or outside environment. For example, the sensor may be configured to monitor for forest fires. To monitor for fires, in some embodiment, the flexible electronic device is attached to a pole, building, structure, tree, or a plant, etc.

Figure 3:
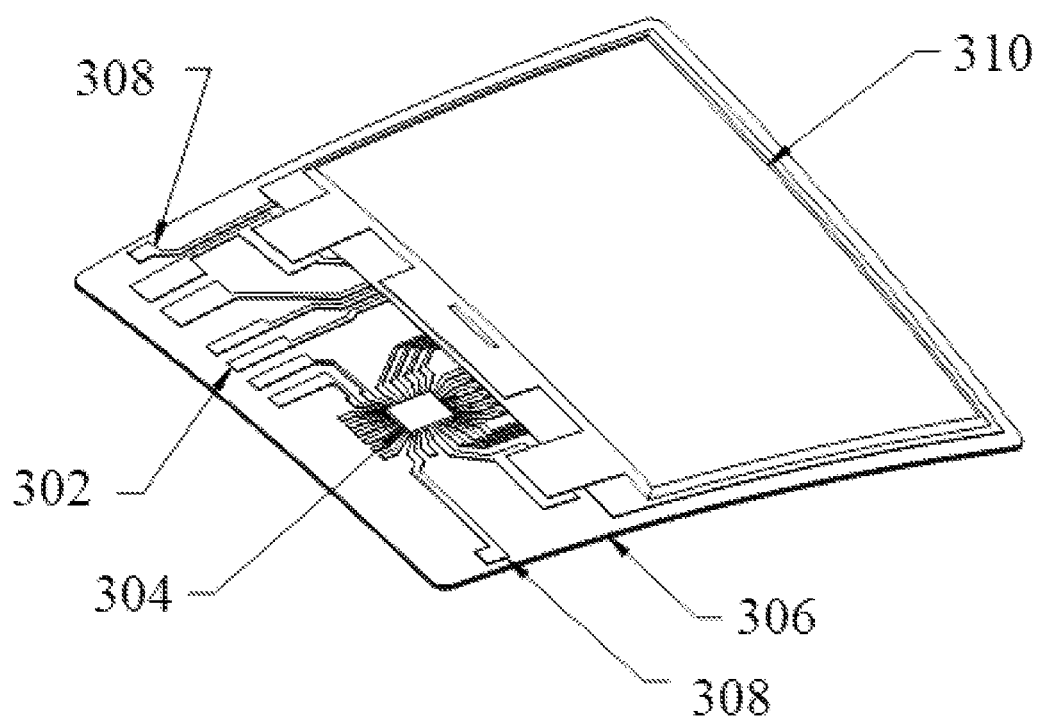
FIG. 3 is an illustration of one possible configuration of the backside of the photovoltaic powered flexible electronic device according to some embodiments of the present disclosure.

FIG. 3 is an illustration of the photovoltaic powered flexible electronic device according to some embodiments. This figure depicts another possible configuration of a flexible light-charging power source as viewed from the back side. The power management circuit 304 is attached directly to the back side of a photovoltaic device and connected to its contacts 308. A flexible energy storage unit 310 is deposited on the photovoltaic substrate 306 and connected to energy storage unit contact pads on the power management circuit 304. Power supply contacts 302 are exposed for integration into commercial products or end-user applications.

In some embodiments, the photovoltaic powered flexible electronic device may comprise a power output. The power output can have a voltage output customized for different applications, ranging from about 1.1V to about 12V tuned to achieve target customer specifications using boost and/or buck converters. In some embodiments, the layout of the flexible electronic device can be used to achieve a desired output voltage. In some embodiments, the output voltage may be 1.1V, 1.2V 1.5V, 1.8V, 2.5V, 3V, 3.3V, 3.6V, 3.7V, 4V, 4.2V, 5V, 5.3V, 6V, 9V, or 12V.

In some embodiments, the power output includes exposed contacts, leads, and/or external connectors 302 for positive and negative terminals of the power source.

In some embodiments, the flexible electronic device may determine the state of charge and/or voltage as an approximation of state of charge of an energy storage unit 310. In some embodiments, the determined state of charge may be displayed on an interface. In some embodiments, the voltage or an approximated voltage of an energy storage unit 310 may be displayed on the interface. In some embodiments, the state of charge and/or voltage of an energy storage unit 310 may be reported or communicated through additional exposed contacts, leads, and/or external connectors.

In certain embodiments, the data for state of charge or voltage or other condition of the energy storage unit is transmitted over an I2C communication protocol.

In other embodiments, the data for state of charge or voltage or other condition of the energy storage unit is transmitted as an analog voltage signal.

A power generation of the flexible electronic device may depend on a spectrum of the light source, an intensity of the light source, and a duration of the light source.

In some embodiments to maximize energy harvesting potential, the absorption of light by the photovoltaic module may be optimized for a specific light source or collection of light sources. For example, the photovoltaic module may be optimized for indoor light sources such as LED light sources, solar simulators, fluorescent light sources, or combinations thereof. In other embodiments, the photovoltaic may be optimized for sunlight for outdoor applications.

In some embodiments, the photovoltaic module may have a broad-spectrum absorption so that energy harvesting is achieved over a variety of different light sources. For example, organic photovoltaics (OPV) offer over twice the power compared to amorphous silicon devices in low light such as indoor light sources. One way these power values can be achieved is by optimizing the absorption of the OPV to an indoor light spectrum(s) or using a broad-spectrum absorption that harvests energy over a variety of spectra. This embodiment enables continuous operating in all lighting conditions, namely in indoor light (twice the energy harvested from the OPV) and also in outdoor light (even if the device is not optimized for outdoor light there will be more energy produced outdoors compared to indoors due to the higher intensity or solar light).

In some embodiments, photovoltaic module may be optimized for any light spectrum, such as sunlight or artificial light (e.g., LED, fluorescent, incandescent, grow lights, neon lights, mercury vapor, metal halide, high-intensity discharge, bioluminescent, chemiluminescent), to increase the energy harvesting from solar for a target spectrum. For example, for a given light spectrum, the optimization could target a specific level of light, ranging from 1 lux to 150,000 lux. In some embodiments, photovoltaic module may be optimized for indoor light, ensuring that whether device is indoors or outdoors, there will be enough light to power device even though photovoltaic module is not optimized for outdoor light.

Figure 4:
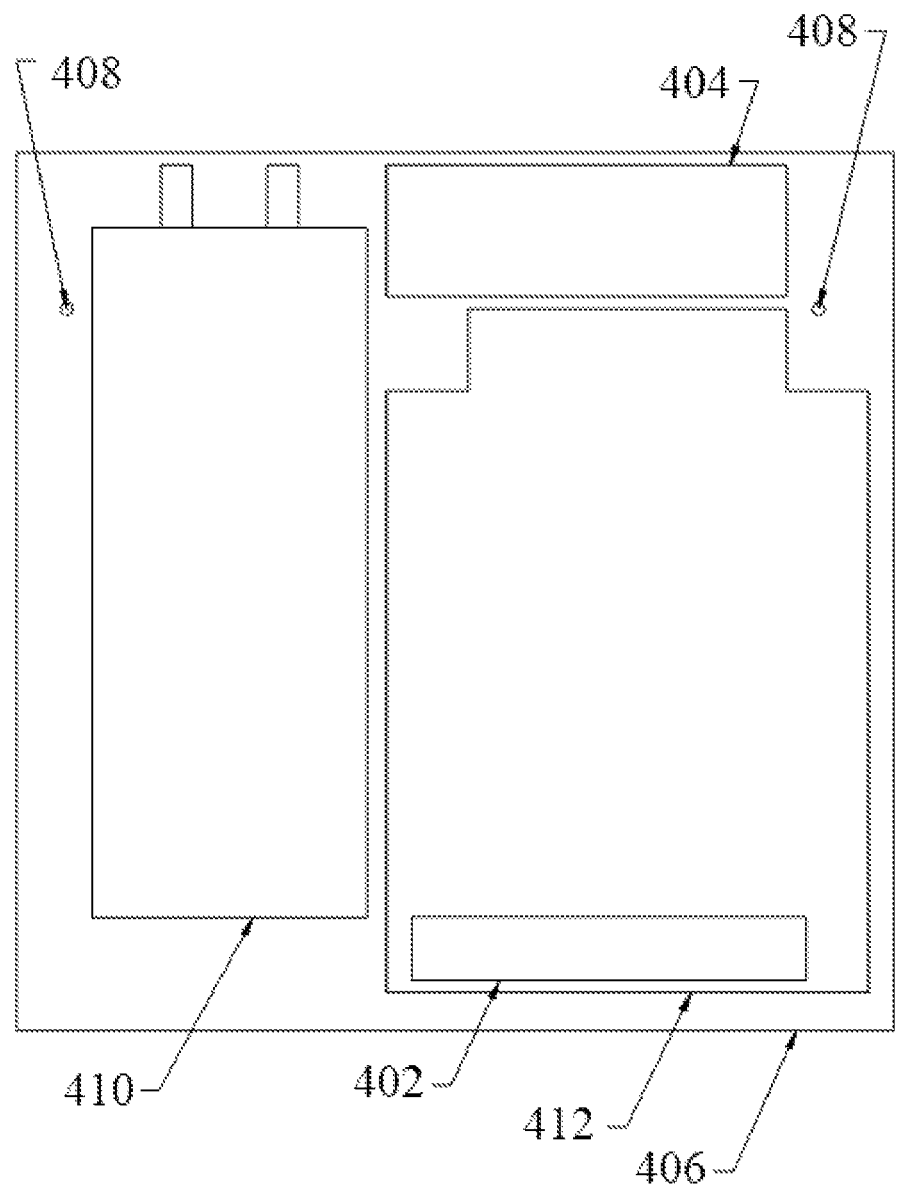
FIG. 4 is an illustration of layout of a portion of the photovoltaic powered flexible electronic device according to some embodiments of the present disclosure.

FIG. 4 is an illustration of layout of a portion of the photovoltaic powered flexible electronic device according to some embodiments. This figure depicts a flexible electronic substrate is laminated to the back of a flexible photovoltaic device.

In some embodiments, the flexible electronic device may be formed by laminating a flexible circuit board to a back of the photovoltaic module 406. In some embodiments, the flexible circuit board comprises a flexible electronic substrate. The flexible electronic substrate may comprise circuitry 412 for power management 404, environment sensing, and radio communication, including an antenna 402. In some embodiments, the flexible circuit board comprises an energy storage unit 410 which is attached to the flexible electronic substrate. The flexible electronic substrate may be electrically connected to photovoltaic contacts 408 of the photovoltaic module through holes in the substrate and photovoltaic packaging.

Figure 5:
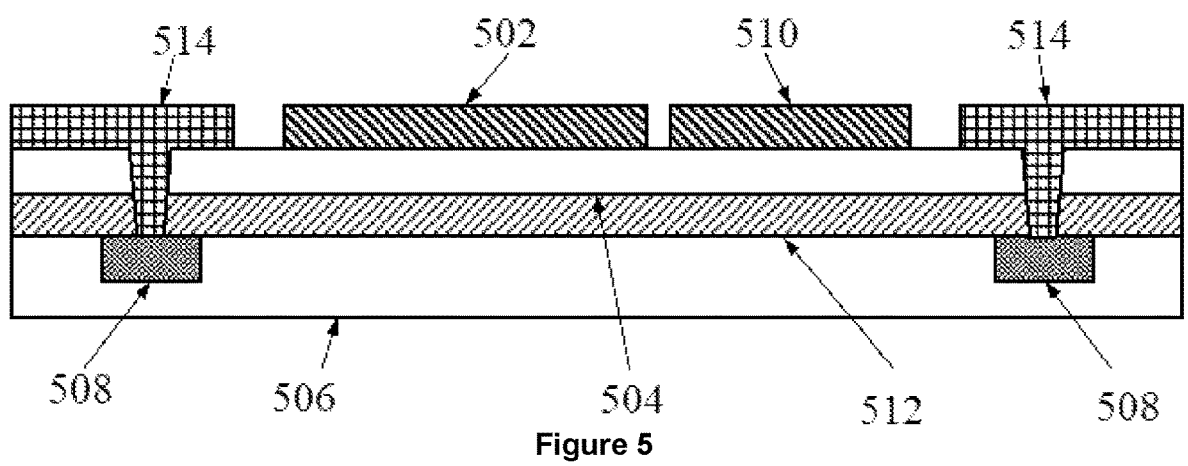
FIG. 5 is a cross-sectional view illustrating a portion of the photovoltaic powered flexible electronic device according to some embodiments of the present disclosure.

FIG. 5 is a cross-sectional view illustrating a portion of the photovoltaic powered flexible electronic device according to some embodiments. This figure depicts a cross-sectional schematic of the layers of a flexible light-powered radio device according to the present disclosure.

In some embodiments, the flexible electronic device may be formed by depositing an adhesive layer 512 onto a flexible photovoltaic module 506. A flexible circuit board 504 may be deposited onto the adhesive layer 512. In some embodiments, a flexible energy storage unit 510 and additional circuit components 502 are attached to the flexible circuit board 504. The photovoltaic contacts 508 are exposed by creating holes in the circuit board 504 and adhesive layers 512, then connected to the circuit board 504 with a conductive ink or epoxy 514.

Figure 6:
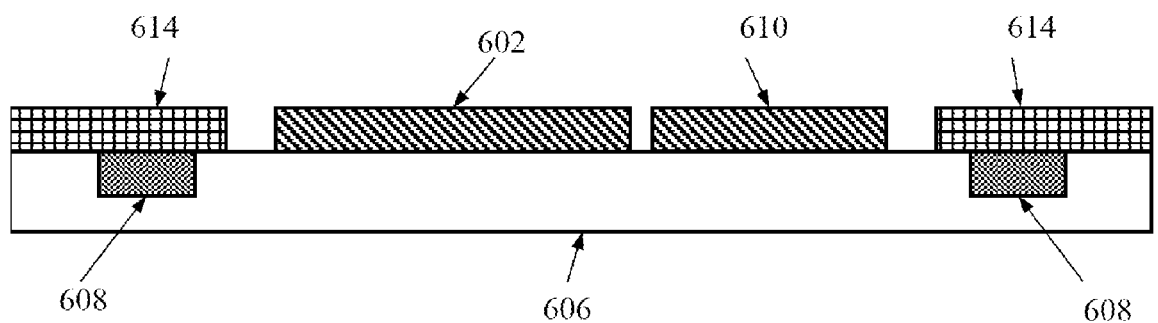
FIG. 6 is a cross-sectional view illustrating a portion of the photovoltaic powered flexible electronic device according to further embodiments of the present disclosure.

FIG. 6 is a cross-sectional view illustrating a portion of the photovoltaic powered flexible electronic device according to some embodiments. This figure depicts a cross-sectional schematic of the layers of a flexible light-powered radio device according to the present disclosure.

In some embodiments, the flexible electronic device may be fabricated by forming a flexible photovoltaic module 606. In certain embodiments, the flexible photovoltaic module 606 may comprise a cover or encapsulation layer at least partially surrounding an active photovoltaic layer of the flexible photovoltaic module 606. In some embodiments, a flexible energy storage unit 610 and additional circuit components 602 are attached, printed, or deposited directly onto the flexible photovoltaic module 606. The photovoltaic contacts 608 are exposed by creating holes in the flexible photovoltaic module 606, then connected to the flexible energy storage unit 610 and additional circuit components 602 using a conductive ink or epoxy 614.

In some embodiments, flexible electronic device may be formed by assembling and/or fabricating flexible electronics on a separate substrate (such as but not limited to metallic and/or resin film composites/laminates, flexible plastic, polyethylene naphthalate (PEN), polyimide (PI, e.g., Kapton®), or copper clad laminates (CCL) on plastic films, including but not limited to polyester, PI, and polytetrafluoroethylene (PTFE, e.g., Teflon®)). Then this electronics substrate is attached to the photovoltaic device using an adhesive (e.g., lamination comprising one or more material chosen from plastics, resins, glass, metals, silicones, and elastomers, wherein the one or more material is applied by one or more of thermal lamination, pressure lamination, vacuum lamination, ultra-violet curing, flame lamination, hot melt lamination, extrusion lamination, dry-bond lamination, wet-bond lamination, and solventless lamination). In some cases, the photovoltaic contacts are exposed prior to attachment to the electronics substrate, while in other cases, they are exposed after attachment to the electronics substrate through the substrate and any adhesive layers. Contacts may be exposed using any method including laser ablation, chemical removal, or mechanical removal, or the photovoltaic may be fabricated with pre-exposed contacts or leads. Then the exposed contacts or leads of the photovoltaic are attached to the circuit of the electronics device by any means, including but not limited to soldering, ultrasonic soldering, conductive epoxy, conductive paste, conductive paints/inks, spot welding, welding, wire bonding, printed conductive inks, mechanical contact, nanowire meshes, graphene- and graphite-based conductive materials, etc.

In some embodiments, device may be made flexible by attaching a flexible electronic device onto a flexible photovoltaic module. A flexible device may have a low stiffness (e.g., less than 100 N/m) and may contain materials with Glass Young's modulus (e.g., less than 150 GPa). In some embodiments, a flexible photovoltaic module may be disposed onto a flexible substrate, wherein the flexible substrate may be made of polymers/thermoplastics (e.g., polyimide and polyester films, polyethylene terephthalate, polypropylene, polycarbonate), composite/multilayered films, willow glass, acrylic, metal/metal alloy foils, paper, fabrics/textiles, and/or other flexible materials.

What is claimed is:

1. A photovoltaic powered flexible electronic device, comprising: a flexible photovoltaic module; a cathode electrode and a anode electrode incorporated into the flexible photovoltaic module, wherein the cathode electrode and the anode electrode are at least partially exposed; and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit comprising a power management device, wherein the recharging circuit is electrically connected to the cathode electrode and anode electrode; an energy storage unit; and a radio emitting device, wherein the photovoltaic powered flexible electronic device comprises a Young's Modulus of 150 GPa or less, wherein the radio emitting device is configured to not affect the bending radius of the photovoltaic powered flexible electronic device.

2. The photovoltaic powered flexible electronic device of claim 1, wherein the energy storage unit comprises a battery or supercapacitor.

3. The photovoltaic powered flexible electronic device of claim 1, wherein the flexible circuit board further comprises a sensor.

4. The photovoltaic powered flexible electronic device of claim 3, wherein the sensor is configured to detect at least one environmental condition and when the environmental condition is detected, the radio emitting device produces a response.

5. The photovoltaic powered flexible electronic device of claim 4, wherein the response is configured to be received by a radio receiving device that alerts a user, initiates an automated response, provides data analytics, trains a machine learning algorithm, or combinations thereof.

6. The photovoltaic powered flexible electronic device of claim 3, wherein the sensor is at least one of a gas sensor and a camera.

7. The photovoltaic powered flexible electronic device of claim 3, wherein the photovoltaic powered flexible electronic device is configured to train a machine learning model using data from the sensor.

8. The photovoltaic powered flexible electronic device of claim 1, wherein the radio emitting device is configured to send data to a gateway device which receives the data.

9. The photovoltaic powered flexible electronic device of claim 1, wherein the radio emitting device is configured to send data to a cloud device which receives the data.

10. The photovoltaic powered flexible electronic device of claim 1, wherein the radio emitting device is configured to be read using a device reader.

11. The photovoltaic powered flexible electronic device of claim 1, wherein the flexible circuit board further comprises resistors, capacitors, inductors, fuses, transistors, diode, PMICs, voltage regulators, boost converter, buck converter, integrated circuits, or a combination thereof, configured to not affect the bending radius of the photovoltaic powered flexible electronic device.

12. The photovoltaic powered flexible electronic device of claim 1, wherein the flexible photovoltaic module comprises an active photovoltaic layer at least partially surrounded by a cover layer.

13. A photovoltaic powered flexible electronic device, comprising: a flexible photovoltaic module; a cathode electrode and a anode electrode incorporated into the flexible photovoltaic module, wherein the cathode electrode and the anode electrode are at least partially exposed; and a flexible circuit board, wherein the flexible circuit board is attached to one of the following: (a) the flexible photovoltaic module, (b) a flexible substrate located on the flexible photovoltaic module, and (c) an adhesive located on the flexible photovoltaic module, the flexible circuit board comprising: a recharging circuit comprising a power management device, wherein the recharging circuit is electrically connected to the cathode electrode and anode electrode; an energy storage unit; and a power supply connector, wherein the photovoltaic powered flexible electronic device comprises a Young's Modulus of 150 GPa or less, wherein the flexible circuit board further comprises an interface, wherein the interface is configured to display a charge or a voltage of the energy storage unit.

14. The photovoltaic powered flexible electronic device of claim 13, wherein the energy storage unit comprises a battery or supercapacitor.

15. The photovoltaic powered flexible electronic device of claim 13, wherein an energy storage unit is electrically connected to the recharging circuit.

16. The photovoltaic powered flexible electronic device of claim 13, wherein the power supply connector comprises at least one of contacts, leads, and external connectors electronically connected to the energy storage unit.

17. The photovoltaic powered flexible electronic device of claim 13, further comprising a product marking on a surface or embedded within the photovoltaic powered flexible electronic device.

18. The photovoltaic powered flexible electronic device of claim 17, wherein the flexible circuit board is attached to the adhesive attached to the flexible photovoltaic module and the product marking is embedded within the adhesive.

19. The photovoltaic powered flexible electronic device of claim 17, wherein the flexible circuit board is attached to the flexible substrate attached to the flexible photovoltaic module and the product marking is embedded within the flexible substrate.

20. The photovoltaic powered flexible electronic device of claim 17, wherein the product marking is located on a front, back, or side surface of the photovoltaic powered flexible electronic device.

21. The photovoltaic powered flexible electronic device of claim 17, wherein the product marking is located on a non-illuminated side of photovoltaic module and the photovoltaic module sufficiently transparent such that the product marking is visible through the photovoltaic powered flexible electronic device.

22. The photovoltaic powered flexible electronic device of claim 13, wherein the flexible circuit board further comprises resistors, capacitors, inductors, fuses, transistors, diode, PMICs, voltage regulators, boost converter, buck converter, integrated circuits, or a combination thereof, configured to not affect the bending radius of the photovoltaic powered flexible electronic device.

23. The photovoltaic powered flexible electronic device of claim 13, wherein the flexible photovoltaic module comprises an active photovoltaic layer at least partially surrounded by a cover layer.

\* \* \* \* \*